US010647307B2

(12) United States Patent
Yoshizu et al.

(10) Patent No.: US 10,647,307 B2
(45) Date of Patent: May 12, 2020

(54) ELECTRIC BOOSTER

(71) Applicant: HITACHI AUTOMOTIVE SYSTEMS, LTD., Ibaraki (JP)

(72) Inventors: Rikiya Yoshizu, Ebina (JP); Shinji Shimizu, Atsugi (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 396 days.

(21) Appl. No.: 15/577,544

(22) PCT Filed: May 13, 2016

(86) PCT No.: PCT/JP2016/064272
§ 371 (c)(1),
(2) Date: Nov. 28, 2017

(87) PCT Pub. No.: WO2016/194582
PCT Pub. Date: Dec. 8, 2016

(65) Prior Publication Data
US 2018/0170328 A1 Jun. 21, 2018

(30) Foreign Application Priority Data

May 29, 2015 (EP) .................................. 2015-110856

(51) Int. Cl.
*B60T 8/34* (2006.01)
*B60T 8/171* (2006.01)
(Continued)

(52) U.S. Cl.
CPC .............. *B60T 8/171* (2013.01); *B60T 7/042* (2013.01); *B60T 8/3255* (2013.01); *B60T 8/44* (2013.01);
(Continued)

(58) Field of Classification Search
CPC ........ B60T 7/042; B60T 8/3255; B60T 13/74; B60T 13/745; B60T 13/746; B60T 2220/04
See application file for complete search history.

(56) References Cited

U.S. PATENT DOCUMENTS

2003/0172651 A1* 9/2003 Zehnder, II ............... B60T 8/38
60/534
2005/0040700 A1 2/2005 Yokoyama et al.
(Continued)

FOREIGN PATENT DOCUMENTS

JP  59-029553  2/1984
JP  2005-067307  3/2005
(Continued)

OTHER PUBLICATIONS

International Search Report dated Jul. 12, 2016 in International Application No. PCT/JP2016/064272.

*Primary Examiner* — Nicholas J Lane
(74) *Attorney, Agent, or Firm* — Wenderoth, Lind & Ponack, L.L.P.

(57) ABSTRACT

Provided is an electric booster which can be downsized by enhancing space efficiency while reducing the effect of a magnetic field from outside on a magnetic sensor by means of a magnetic shield. The stroke amount of an input plunger 29 connected to a brake pedal 6 is detected by a stroke detection sensor. The operation of an electric motor is controlled by controller on the basis of the stroke amount of the input plunger to thrust a primary piston through a ball screw mechanism, and brake fluid pressure is thus generated by a master cylinder 4. The stroke detection device uses a Hall IC to detect magnetic flux densities from first and second magnet members mounted on the input plunger to obtain the stroke of the input plunger. The first and second magnet members and the Hall IC are disposed inside a (Continued)

linear-motion member formed of a cylindrical magnetic body of the ball screw mechanism to be magnetically shielded.

15 Claims, 6 Drawing Sheets

(51) Int. Cl.

| | | |
|---|---|---|
| *G01R 33/07* | (2006.01) | |
| *B60T 13/74* | (2006.01) | |
| *B60T 7/04* | (2006.01) | |
| *B60T 8/32* | (2006.01) | |
| *B60T 8/44* | (2006.01) | |
| *G01B 7/00* | (2006.01) | |
| *G01D 5/14* | (2006.01) | |
| *B60T 11/16* | (2006.01) | |

(52) U.S. Cl.
CPC ............ *B60T 13/74* (2013.01); *B60T 13/745* (2013.01); *G01B 7/00* (2013.01); *G01D 5/145* (2013.01); *G01R 33/07* (2013.01); *B60T 11/16* (2013.01)

(56) References Cited

U.S. PATENT DOCUMENTS

| | | | |
|---|---|---|---|
| 2012/0073286 A1* | 3/2012 | Takayama | B60T 13/745 60/538 |
| 2012/0091788 A1* | 4/2012 | Weiberle | B60T 7/042 303/15 |
| 2012/0324882 A1* | 12/2012 | Mori | B60T 13/745 60/545 |
| 2015/0323346 A1 | 11/2015 | Maiterth et al. | |
| 2017/0043756 A1* | 2/2017 | Drumm | B60T 7/042 |

FOREIGN PATENT DOCUMENTS

| | | |
|---|---|---|
| JP | 2014-091359 | 5/2014 |
| JP | 2015-021745 | 2/2015 |
| JP | 2015-537207 | 12/2015 |

\* cited by examiner

ELECTRIC BOOSTER

TECHNICAL FIELD

The invention relates to an electric booster configured to detect the amount of operation of the pedal of a vehicle, such as an automobile, and generate a brake fluid pressure in a master cylinder.

BACKGROUND ART

For example, Patent Literature 1 discloses, as technology on electric boosters, a vehicle brake system including a brake assist device which boosts a brake pedal effort by a motor being driven, and a stroke detection device which detects a movement position of an input rod on the basis of a brake pedal operation amount. In this vehicle brake system, the hydraulic pressure of brake fluid is controlled by the brake assist device to feed the brake fluid to a hydraulic control unit on the basis of the brake pedal operation amount detected by the stroke detection device.

CITATION LIST

Patent Literature

PTL 1: Japanese Unexamined Patent Application Publication (Kokai) No. 2015-21745

SUMMARY OF INVENTION

Technical Problem

The stroke detection device used in the vehicle brake system discussed in the Patent Literature 1 employs a constitution in which the magnetic flux density of a magnetic body mounted on the input rod is detected by a Hall sensor unit provided to the cover of a casing. In other words, a magnetic flux change made by the movement of the input rod is detected by a Hall element to obtain a stroke amount (movement position). The stroke detection device which detects a change in the magnetic flux density of the magnetic body by using the Hall element as described is desirably provided with a magnetic shield for the purpose of reducing the effect of a magnetic field from outside to secure detection accuracy.

However, magnetic shielding requires a space for covering the input rod mounted with the magnetic body, and the flail sensor unit with the magnetic shield, which increases the size of the electric booster.

The invention has been made in light of the above-mentioned points. It is an object of the invention to provide an electric booster which can be downsized by enhancing space efficiency while reducing an effect of a magnetic field from outside on a magnetic sensor (magnetic flux detection device) by means of a magnetic shield.

Solution to Problem

In order to solve the problem mentioned above, the invention relates to an electric booster including an electric motor; an assist mechanism configured to be driven by the electric motor to thrust a piston of a master cylinder; a housing which houses the assist mechanism; an input member connected to a brake pedal and extending in the housing; a stroke detection device configured to detect a stroke of the input member in relation to the housing; and a control device configured to control operation of the electric motor on the basis of a stroke amount of the input member, which is detected by the stroke detection device. The stroke detection device includes a magnet member mounted on the input member, and a magnetic flux density detection device mounted on the housing and configured to detect a magnetic flux density generated in the magnet member. The assist mechanism includes a linear-motion member formed of a cylindrical magnetic body which thrusts the piston. The magnetic flux density detection device is configured to be positioned inside the linear-motion member at least when the detection of the magnetic flux density of the magnet member by the magnetic flux density detection device is performed.

Advantageous Effects of Invention

The electric booster according to the present invention can be downsized by enhancing space efficiency while reducing an effect of a magnetic field from outside on a magnetic sensor (magnetic flux detection device) by means of a magnetic shield.

DESCRIPTION OF EMBODIMENTS

Embodiments of the invention will be discussed below in details with reference to the drawings.

An electric booster according to a first embodiment will be described with reference to FIGS. 1 to 4.

The electric booster according to the present embodiment is applied to a brake system for a vehicle such as an electric vehicle and a hybrid electric vehicle. In the following description, the left side of the drawings will be referred to as a front side (vehicle front side), and the right side of the drawings will be referred to as a rear side (vehicle rear side).

Figure 1:
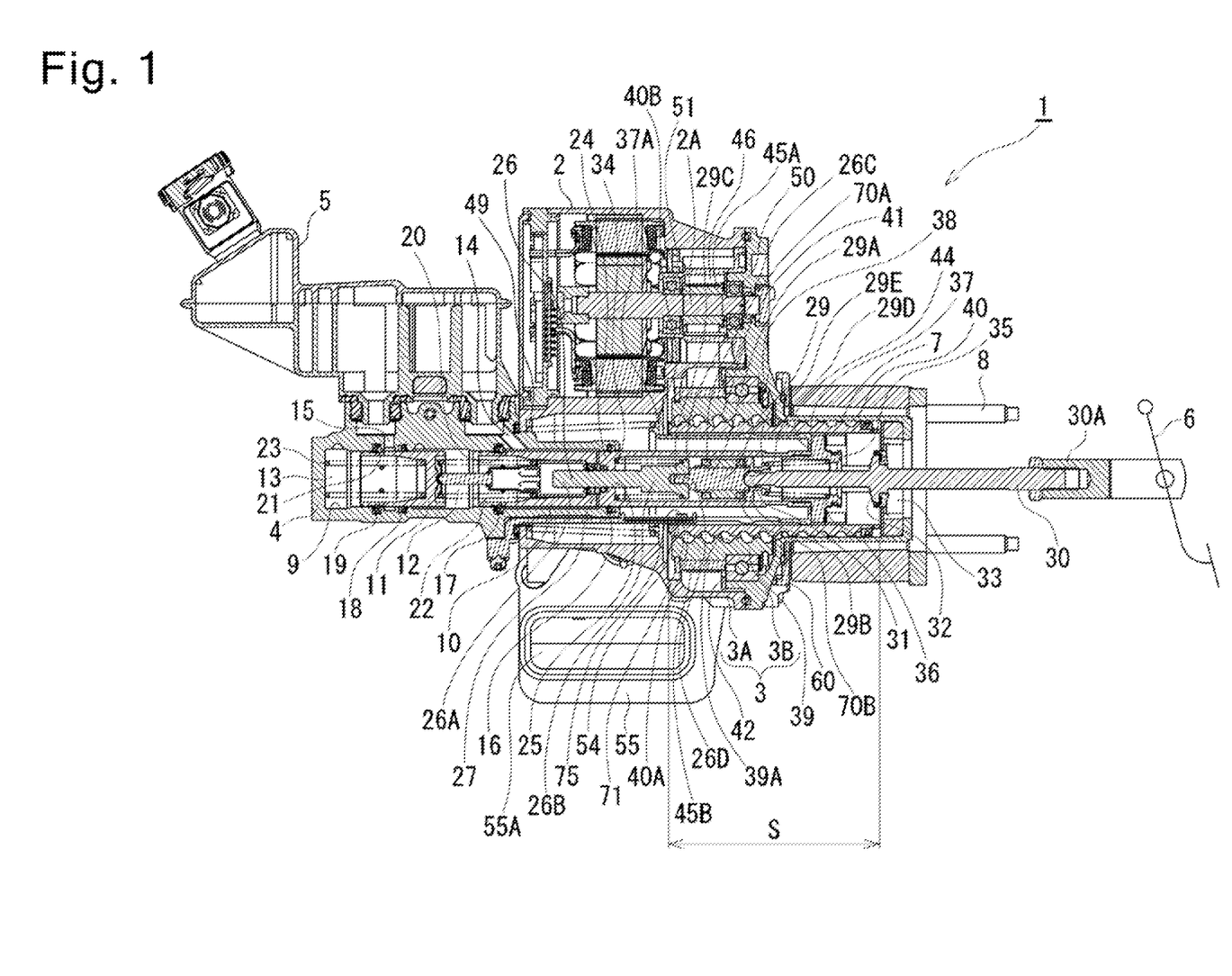
FIG. 1 is a longitudinal sectional view showing a non-braking state in which an electric booster according to a first embodiment of the invention is located in an initial position.

With reference to FIG. 1, an electric booster 1 according to the present embodiment roughly includes a housing 3, an input plunger 29, an electric motor 2, a ball screw mechanism 38, a stroke detection device 54, and a controller 55. The input plunger 29 extends in the housing 3 and is connected to a brake pedal 6 via an input rod 30 to construct an input member together with the input rod 30. The electric motor 2 is disposed in the housing 3. Upon activation of the electric motor 2, the ball screw mechanism 38 thrusts a primary piston 10 and a secondary piston 11 of a master cylinder 4. The ball screw mechanism 38 is configured as an assist mechanism. The stroke detection device 54 detects a stroke amount (movement position) of the input plunger 29 (input rod 30) in relation to the housing 3. The controller 55 is a control device configured to control the activation of the electric motor 2 on the basis of the stroke amount (movement position) of the input plunger 29, which is detected by the stroke detection device 54.

The electric booster 1 has a structure in which the master cylinder 4 of a tandem type is connected to a front side (left side of the drawing) of the housing 3. Mounted on an upper side of the master cylinder 4 is a reservoir 5 configured to feed brake fluid to the master cylinder 4. The housing 3 includes a front housing 3A which houses the electric motor 2, the ball screw mechanism 38 and other parts, and a rear housing 3B which blocks a rear-end opening (right-side end opening in the drawing) of the front housing 3A. In the rear housing 3B, a cylindrical portion 7 is formed concentrically with the master cylinder 4 to project from a rear side of the housing 3, that is, in a direction away from the master cylinder 4. An attachment plate 60 is secured around the cylindrical portion 7 of the rear housing 3B. A plurality of stud bolts 8 are fixed to the attachment plate 60. In a state where the input rod 30 is projecting from a dash panel (not shown) which is a partition wall between an engine room and a vehicle interior of the vehicle, into the vehicle interior, the electric booster 1 is disposed inside the engine room and secured to the dash panel by means of the plurality of stud bolts 8.

In the master cylinder 4, there is formed a bottomed cylinder bore 9. A primary piston 10 (piston) having a generally cylindrical shape is disposed on an opening side of the cylinder bore 9. The primary piston 10 has a front end side which is formed to have a cup-like shape. The primary piston 10 is disposed inside the cylinder bore 9. On a bottom side of the cylinder bore 9, there is disposed a cup-like secondary piston 11. The primary piston 10 has a rear end portion which extends from the opening of the master cylinder 4 into the housing 3 and further extends into the cylindrical portion 7 of the rear housing 3B. In the cylinder bore 9 of the master cylinder 4, a primary chamber 12 is formed between the primary piston 10 and the secondary piston 11, and a secondary chamber 13 is formed between the bottom of the cylinder bore 9 and the secondary piston 11.

The primary chamber 12 and the secondary chamber 13 of the master cylinder 4 are connected to wheel cylinders of wheels (not shown) by a dual hydraulic circuit from a hydraulic port of the master cylinder 4 via a hydraulic control unit (not shown). Hydraulic pressure of the brake fluid generated by the master cylinder 4 or the hydraulic control unit is fed to the wheel cylinders of the wheels to generate a braking force.

The master cylinder 4 is provided with reservoir ports 14 and 15 for connecting the primary chamber 12 and the secondary chamber 13 to the reservoir 5, respectively. In order to divide the inside of the cylinder bore 9 into the primary chamber 12 and the secondary chamber 13, a ring-like piston seals 16, 17, 18 and 19 are disposed in an inner peripheral surface of the cylinder bore 9. The piston seals 16, 17, 18 and 19 contact the primary piston 10 and the secondary piston 11 and are arranged at predetermined intervals along an axial direction. The piston seals 16 and 17 are arranged on both sides of the one reservoir port 14 (rear side) along the axial direction. When the primary piston 10 is located in a non-braking position shown in FIG. 1, the primary chamber 12 is in communication with the reservoir port 14 through a piston port 20 formed in a lateral wall of the primary piston 10. When the primary piston 10 moves from the non-braking position in a forward direction to make the piston port 20 reach the one piston seal 17, the primary chamber 12 is blocked from the reservoir port 14 by the piston seal 17, and hydraulic pressure is generated.

In the same manner, the other two piston seals 18 and 19 are arranged on both sides of the reservoir port 15 (front side) along the axial direction. When the secondary piston 11 is in the non-braking position shown in FIG. 1, the secondary chamber 13 is in communication with the reservoir port 15 via a piston port 21 which is formed in a lateral wall of the secondary piston 11. The secondary piston 11 moves from the non-braking position in the forward direction to cause the piston seal 19 to block the secondary chamber 13 from the reservoir port 15, to thereby generate the hydraulic pressure.

A spring 22 is interposed between the primary piston 10 and the secondary piston 11. A spring 23 is interposed between the bottom of the cylinder bore 9 and the secondary piston 11. The primary piston 10 as a whole is formed into a generally cylindrical shape. An intermediate wall 24 is disposed at an axial midpoint inside the primary piston 10. The intermediate wall 24 is axially pierced by a guide bore 25. An input piston 26 is partially inserted in the guide bore 25 in a slidable and liquid-tight manner. The input piston 26 is formed to have a stepped shape including a small-diameter portion 26A positioned on the front side and a large-diameter portion 26B extending continuously from the small-diameter portion 26A in the rearward direction. The small-diameter portion 26A of the input piston 26 is slidably and liquid-tightly inserted in the guide bore 25.

A seal 27 seals a gap between an outer peripheral surface of the small-diameter portion 26A of the input piston 26 and an inner peripheral surface of the guide bore 25 formed in the intermediate wall 24 of the primary piston 10. In a rear end of the large-diameter portion 26B of the input piston 26, there is formed a spring seat 26C having an outer flange-like shape. The input piston 26 has a rear end face in which a guide concave portion 261) is formed. The small-diameter portion 26A of the input piston 26 has a front end portion facing the primary chamber 12 of the master cylinder 4. The input piston 26 is capable of making a relative axial displacement in relation to the primary piston 10.

The input plunger 29 is displaceably guided along the axial direction into the rear part of the input piston 26 located in a rear inside of the primary piston 10. The input plunger 29 integrally includes a shaft 29A, a ring-like portion 29B, a small-diameter projection 29C, a spherical concave portion 291), and a spring seat 29E. The ring-like portion 29B is formed in an axial rear end of the shaft 29A so as to project in a radially outward direction. The small-diameter projection 29C is formed to project from a front end face of the shaft 29A in the forward direction. The spherical concave portion 291) is formed in a rear end face of the shaft 29A. The spring seat 29E is formed to project from a circumference of the spherical concave portion 29D in the rearward direction. The input rod 30 has a front end portion in which a ball joint 31 is disposed. The ball joint 31 is coupled to the spherical concave portion 291) of the input plunger 29 and allows the input rod 30 to be inclined relative to the axial direction to some degree. The small-diameter projection 29C of the input plunger 29 is disposed in the guide concave portion 26D formed in the rear end face of the input piston 26.

A front end side of the input rod 30, which is coupled to the input plunger 29, is disposed in the cylindrical portion 7 of the rear housing 3B and the rear inside of the primary piston 10. A rear end side of the input rod 30 extends from the cylindrical portion 7 to the outside. The brake pedal 6 is connected to the rear end portion of the input rod 30 via a clevis 30A. Upon operation of the brake pedal 6, the input rod 30 is displaced in the axial direction. The input rod 30 is provided with a stopper contact portion 32 having a flanged shape in an almost middle region of the input rod 30. In a rear end portion of the cylindrical portion 7, there is formed a stopper 33 extending in a radially inward direction. A retreat position of the input rod 30 is defined when the stopper contact portion 32 of the input rod 30 comes into contact with the stopper 33.

A first spring 34 which is a compression coil spring is interposed between the intermediate wall 24 of the primary piston 10 and the spring seat 26C formed in the rear end portion of the input piston 26. A second spring 36 which is a compression coil spring is interposed between the spring seat 29E disposed in the rear end portion of the input plunger 29 and a spring seat 35 attached to the rear end portion of the primary piston 10. A cylindrical member 37 is disposed within a cylindrical threaded shaft 40 forming a ball screw mechanism 38 which will be described later. The cylindrical member 37 has a rear end portion which is in contact with a front face of an outer peripheral portion of the spring seat 35 and forwardly extends slightly beyond a front end of the threaded shaft 40. The cylindrical member 37 has a front end face in which a spring seat 37A is formed.

When the brake pedal 6 is not in operation, the input piston 26 and the input plunger 29 are retained in relation to the primary piston 10 by the first spring 34 and the second spring 36 at an initial position shown in FIG. 1. To be more specific, the input piston 26 and the input plunger 29 are resiliently retained in relation to the primary piston 10 at a position where a biasing force of the first spring 34 and a biasing force of the second spring 36 balance each other. The input piston 26 and the input plunger 29 can be forwardly and rearwardly displaced from the initial position in relation to the primary piston 10.

The ball screw mechanism 38 as an assist mechanism is housed in the housing 3. The ball screw mechanism 38 is a rotation-linear motion conversion mechanism configured to be driven by the electric motor 2 disposed in the housing 3, convert rotational motion into linear motion, and provide a thrust force to the primary piston 10. The ball screw mechanism 38 has a nut member 39 that is a rotary member and the threaded shaft 40 that is a linear-motion member. The nut member 39 is supported by a bearing 42 so as to be rotatable within the housing 3. The bearing 42 is secured to the rear housing 3B.

The threaded shaft 40 is formed into a cylindrical shape. The threaded shaft 40 extends from the inside of the nut member 39 into the cylindrical portion 7 of the housing 3. The threaded shaft 40 is supported by the housing 3 in such a manner that the thread shaft 40 can be displaced along the axial direction, and yet cannot rotate around the axis. The threaded shaft 40 is biased in a retreat direction by a biasing force of a return spring 49 that is a compression coil spring interposed between the bottom of the front housing 3A and the spring seat 37A disposed in a front end of the cylindrical member 37. Spiral grooves 39A and 40A are formed in an inner peripheral surface of the nut member 39 and an outer peripheral surface of the threaded shaft 40, respectively. Balls 41 that are a plurality of rolling elements are loaded between the spiral grooves 39A and 40A with grease. The threaded shaft 40 is guided by the stopper 33 of the cylindrical portion 7 so as to be displaceable along the axial direction and supported so as not to rotate around the axis. Along with the rotation of the nut member 39, therefore, the balls 41 roll along the spiral grooves 39A and 40A, and the threaded shaft 40 is displaced in the axial direction. The ball screw mechanism 38 is capable of converting rotation into linear motion and vice versa between the nut member 39 and the threaded shaft 40.

The rear end portion of the primary piston 10 is inserted in the threaded shaft 40, and a rear face of the outer peripheral portion of the spring seat 35 comes into contact with a stepped portion 44 including a plurality of projections formed in an inner peripheral portion of the threaded shaft 40. In this way, a retreat position of the primary piston 10 relative to the threaded shaft 40 is defined. In response to the contact with the stepped portion 44, the primary piston 10 is pushed forward by the stepped portion 44 together with the cylindrical member 37 through forward movement of the threaded shaft 40. Even when the threaded shaft 40 does not move forward, the primary piston 10 can be separated from the stepped portion 44 to move forward independently due to the forward movement of the input rod 30, the input piston 26, and the input plunger 29.

The electric motor 2 is housed in the housing 3 to be placed on a different axis from the master cylinder 4, the input rod 30, and the ball screw mechanism 38. A pulley 45A is mounted on an output shaft 2A of the electric motor 2. The output shaft 2A is rotatably supported by bearings 50 and 51 within the housing 3. A pulley 45B is mounted on the nut member 39 of the ball screw mechanism 38. A belt 46 is wound around the pulley 45A of the output shaft 2A and the pulley 45B of the nut member 39. The electric motor 2 rotates the nut member 39 of the ball screw mechanism 38 through the pulleys 45A and 45B and the belt 46.

The electric booster 1 is provided with a rotational position sensor (not shown) configured to detect a rotational position of the electric motor 2; a stroke detection device 54 which is a stroke detection device configured to detect a stroke amount of the input plunger 29, which is generated by the operation of the brake pedal 6; and a hydraulic sensor (not shown) configured to detect hydraulic pressures of the primary chamber 12 and the secondary chamber 13 of the master cylinder 4. On the basis of these output signals, the controller 55 controls the operation of the electric motor 2. The controller 55 can be connected, if necessary, to a vehicle-mounted controller or another device, for implementing various kinds of brake control, such as regenerative cooperative control, brake assist control, and automatic brake control. A reference mark 55A in the drawings represents a cabling connector for performing power supply of the electric motor 2, the controller 55, and the stroke detection device 54 and communication of control signals.

The stroke detection device 54 includes a plurality of magnet members 70A and 70B and a Hall sensor unit 71. The plurality of magnet members 70A and 70B, namely, first and second magnet members 70A and 70B are secured to the input plunger 29 and arranged so that magnetic poles are aligned along a displacement direction of the input plunger 29. The Hall sensor unit 71 are mounted on the master cylinder 4 inserted in the housing 3 and secured so as to be opposed to the first and second magnet members 70A and 70B. The first and second magnet members 70A and 70B are formed into a ring-like shape and arranged in an outer periphery of respective end portions of the input plunger 29 so as to be axially spaced from each other. The Hall sensor unit 71 is configured to detect a magnetic flux density across a Hall IC 75 (Hall element) from displacement of the first and second magnet members 70A and 70B displaced with the input plunger 29, and output a voltage signal according to the displacement of the input plunger 20 (first and second magnet members 70A and 70B). The first and second magnet members 70A and 70B are opposed to the Hall sensor unit 71 with a lateral wall of a rear portion of the primary piston 10 intervening therebetween. The Hall IC 75 is disposed so that the magnetic flux density of at least one of the first magnet 70A or the second magnet 70B may be detected, regardless of the position of the input plunger 29 displaced by the operation of the brake pedal 6. The first and second magnet members 70A and 70B are disposed so that an end portion 40B of the threaded shaft 40 (linear-motion member), which is located on the master cylinder 4 side, is positioned on the master cylinder 4 side when the brake pedal 6 is not in operation. The Hall IC 75 here forms a magnetic flux density detection device according to the present embodiment.

The Hall sensor unit 71 rearwardly extends from the master cylinder 4 and is inserted in the cylindrical threaded shaft 40 of the ball screw mechanism 38. The Hall IC 75 which is the magnetic flux density detection device configured to detect magnetic flux densities of the first and second magnet members 70A and 70B is disposed within the cylindrical threaded shaft 40. The Hall IC 75 is disposed so that the end portion 40B of the threaded shaft 40 (linear-motion member), which is located on the master cylinder 4 side, is positioned on the master cylinder 4 side when the brake pedal 6 is not in operation. The first and second magnet members 70A and 70B displaced with the input plunger 20, and the Hall IC 75 are normally located within the threaded shaft 40, regardless of an axial position of the threaded shaft 40 which is axially displaced by rotation of the nut member 39. The threaded shaft 40 is formed of a magnetic body. The first and second magnet members 70A and 70B and the Hall IC 75 are therefore magnetically shielded at any time by the threaded shaft 40. According to the present embodiment, the first and second magnet members 70A and 70B and the Hall IC 75 are disposed so that the master cylinder 4-side end portion 40B of the threaded shaft 40 (linear-motion member) is positioned on the master cylinder 4 side when the brake pedal 6 is not in operation. However, if the end portion 40B of the threaded shaft 40 is positioned closer to the master cylinder 4 than the first and second magnet members 70A and 70B and the Hall IC 75 before the detection of the magnetic flux density of at least one of the first magnet member 70A or the second magnet member 70B begins, the master cylinder 4-side end portion 40B of the threaded shaft 40 (linear-motion member) may be located closer to the brake pedal 6 than the first and second magnet members 70A and 70B or the Hall IC 75 in the state where the brake pedal 6 is not in operation.

Operation of the electric booster 1 applied with current will be now discussed.

FIG. 1 shows the initial position in a non-braking state where the input rod 30 and the threaded shaft 40 of the ball screw mechanism 38 are in most retreated positions. If the brake pedal 6 is operated to move the input rod 30 forward, an operation amount of the brake pedal (stroke amount of the input rod 30) is detected on the basis of the voltage signal which is outputted by the Hall IC 75 according to the displacement of the first and second magnet members 70A and 70B mounted on the input plunger 29. On the basis of the stroke amount of the input rod 30, the controller 55 controls the operation of the electric motor 2. The signal outputted by the Hall IC 75 may be a current signal, a digital signal or another signal, instead of the voltage signal. The threaded shaft 40 is moved forward when the nut member 39 of the ball screw mechanism 38 is rotationally driven by the electric motor 2 through the pulleys 45A and 45B and the belt 46. The spring seat 35 of the primary piston 10 is then pressed by the stepped portion 44 of the threaded shaft 40. This makes the primary piston 10 move forward and follow the stroke of the input rod 30. As the result, hydraulic pressure is generated in the primary chamber 12 to be transmitted through the secondary piston 11 to the secondary chamber 13. In this manner, the brake fluid pressure generated in the master cylinder 4 is supplied to the wheel cylinders of the wheels and generates the braking force through friction braking.

When the operation of the brake pedal 6 is released, the controller 55 reversely rotates the electric motor 2 on the basis of the stroke amount of the input rod 30. This causes the primary piston 10 and the secondary piston 11 to retreat, and then decreases the brake fluid pressure of the master cylinder 4, to thereby release the braking force.

Figure 2:
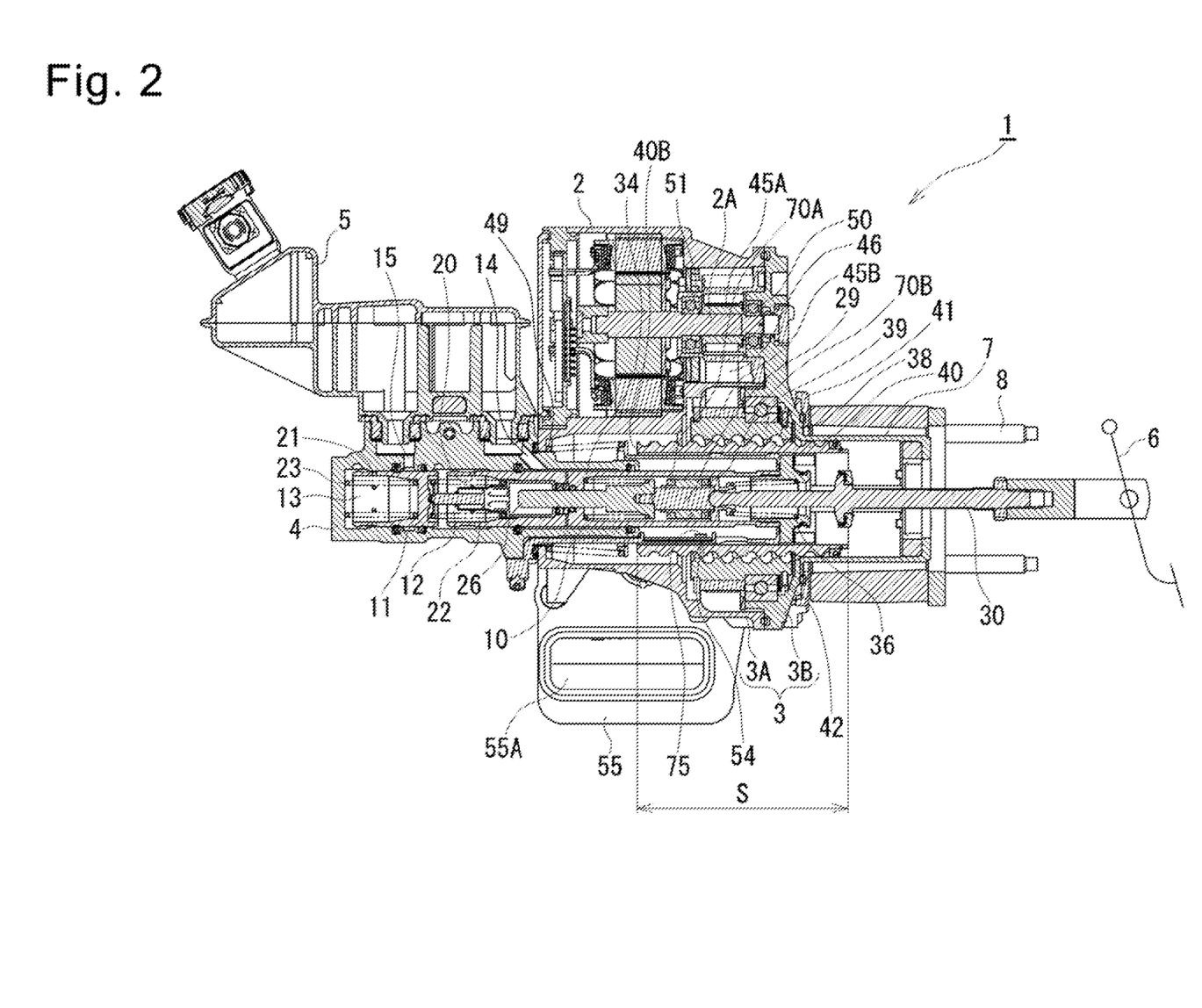
FIG. 2 is a longitudinal sectional view showing a state in which boosting control is being implemented in the electric booster shown in FIG. 1.

During the generation of hydraulic pressure, the hydraulic pressure of the primary chamber 12 is received by the small-diameter portion 26A of the input piston 26, and a reaction force thereof is transmitted to the brake pedal 6 through the input plunger 29 and the input rod 30. This makes it possible to implement boost control which generates a desired braking force at a predetermined boost ratio (ratio of a hydraulic pressure output to an operation force of the brake pedal 6). FIG. 2 shows a state in which the threaded shaft 40 of the ball screw mechanism 38 follows the stroke of the input piston 26 and moves forward due to the boost control.

The controller 55 is capable of adjusting a relative position between the input piston 26 and the primary piston 10 which follows the input piston 26 by controlling the operation of the electric motor 2. More specifically, the controller 55 can increase the hydraulic pressure output relative to the operation of the brake pedal 6 by adjusting the position of the primary piston 10 in the forward direction, that is, to the master cylinder 4 side, in relation to a stroke position of the input piston 26. The controller 55 can also decrease the hydraulic pressure output relative to the operation of the brake pedal 6 by adjusting the position of the primary piston 10 in the rearward direction, that is, to the brake pedal 6 side, in relation to the stroke position of the input piston 26. In the foregoing situations, fluctuation of a reaction force acting on the brake pedal 6 along with fluctuation of the hydraulic pressure output is prevented or reduced due to action of the first spring 34 and the second spring 36. This makes it possible to implement not only the boost control but also brake control, such as brake assist control, automatic brake control, adaptive cruise control, and regenerative cooperative control.

Figure 3:
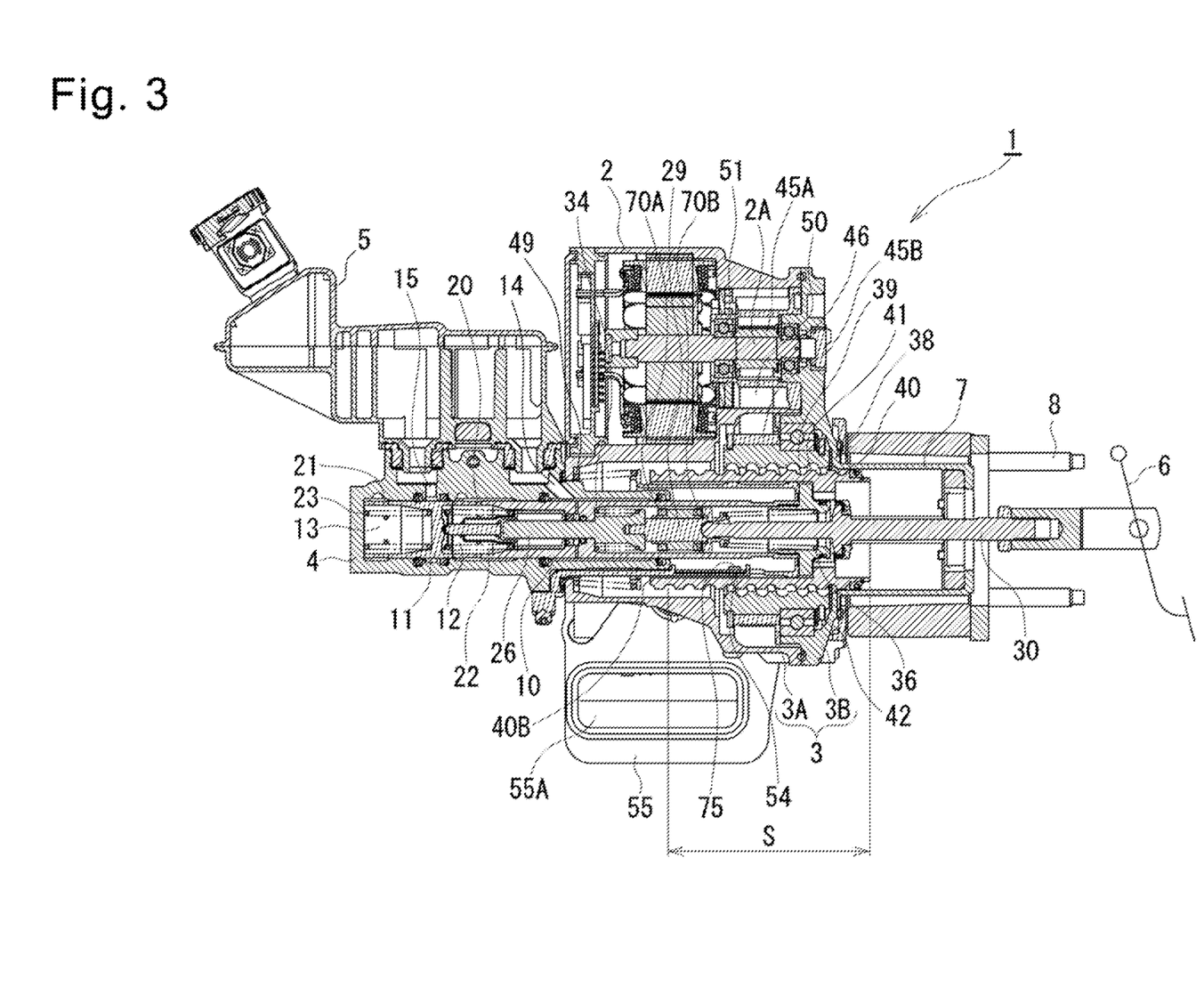
FIG. 3 is a longitudinal sectional view showing a state in which an input rod reaches a maximum stroke in a forward direction relative to a primary piston in the electric booster shown in FIG. 1.
Figure 4:
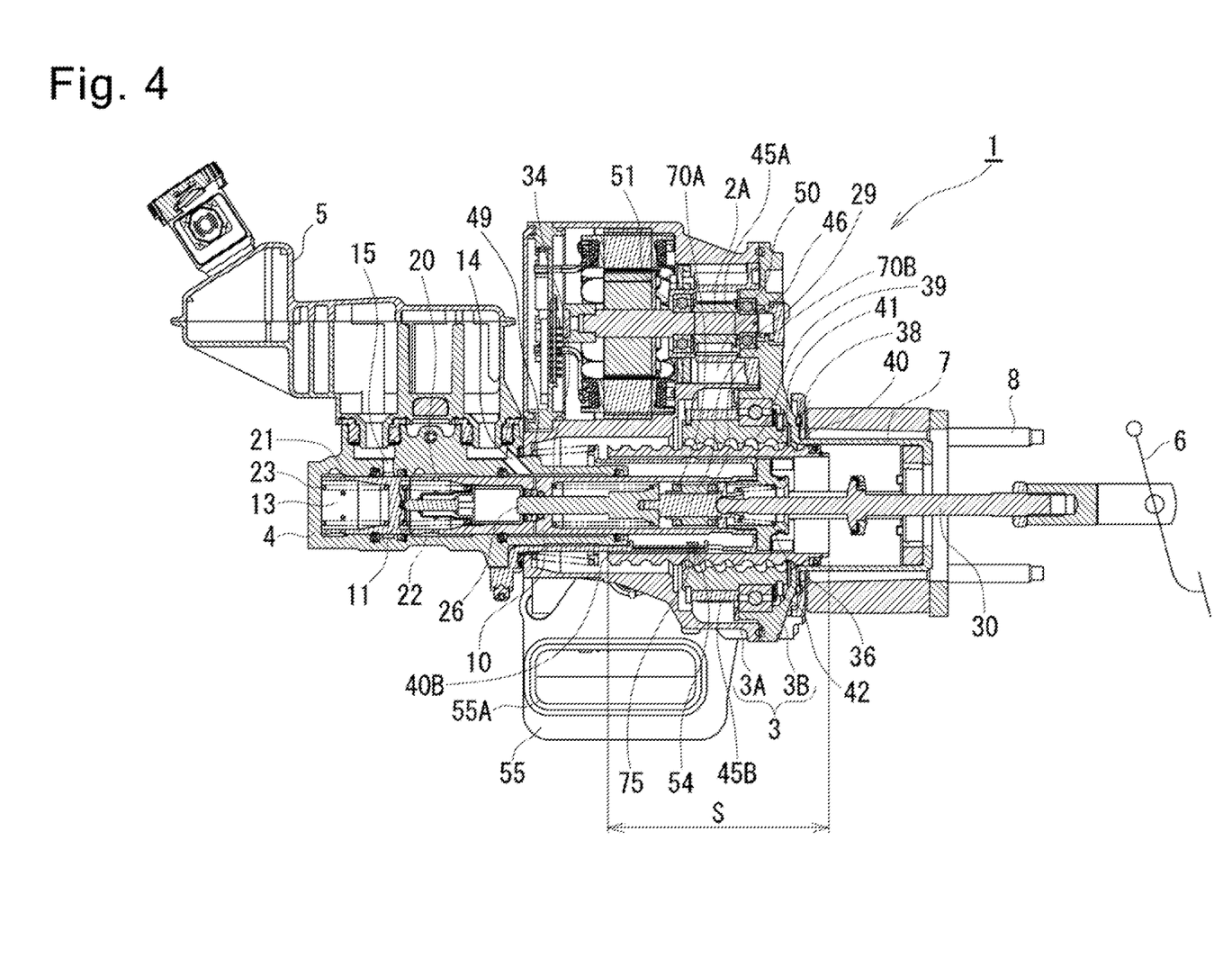
FIG. 4 is a longitudinal sectional view showing a state in which automatic brake control is being implemented in the electric booster shown in FIG. 1.

FIG. 3 shows a state in which the input rod 30 and the threaded shaft 40 (primary piston) reach maximum strokes in the forward direction during the boost control, the regenerative cooperative control or another control. FIG. 4 shows a state in which the threaded shaft 40 (primary piston 10) makes a stroke in the forward direction in relation to the stroke of the input rod 30 during the brake assist control, the automatic brake control or another control. In FIGS. 1 to 4, a reference mark S represents an axial length of the threaded shaft 40 of the ball screw mechanism 38, that is, a region in which the threaded shaft 40 formed of the magnetic body magnetically shields the inside thereof.

As shown in, for example, FIGS. 1 to 4, the first and second magnet members 70A and 70B and the Hall IC 75 are normally located within a range of the region S in the inside of the threaded shaft 40 and magnetically shielded by the threaded shaft 40 formed of the magnetic body, regardless of the axial position of the threaded shaft 40 which is axially displaced by the rotation of the nut member 39. This makes it possible to reduce the effect of magnetism from outside, which is caused by the electric motor 2 and the like, and then improve detection accuracy of the operation amount of the brake pedal (stroke amount of the input rod 30). At this time, the threaded shaft 40 of the ball screw mechanism 38, which is the magnetic body, is used as a magnetic shield, so that there is no need for an additional component for magnetic shielding. This offers an excellent space efficiency and enables the electric booster 1 to be downsized.

Next, an electric booster according to a second embodiment of the invention will be discussed below with reference to FIGS. 5 and 6. In the following description, the same components as those of the first embodiment will be provided with the same reference marks, and only different components will be explained in details.

Figure 5:
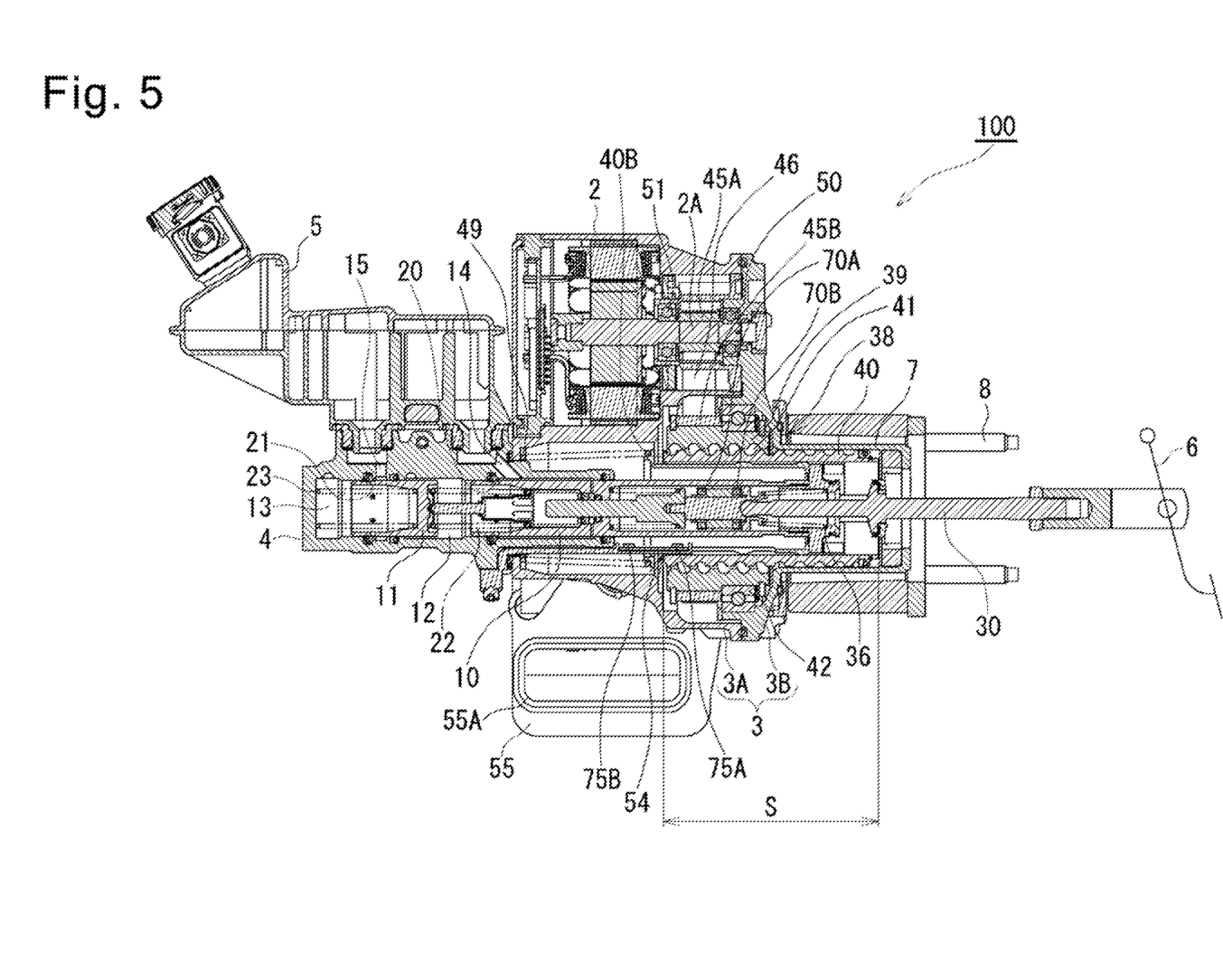
FIG. 5 is a longitudinal sectional view showing a non-braking state in which an electric booster according to a second embodiment of the invention is located in an initial position.

As shown in FIG. 5, in an electric booster 100 according to the present embodiment, a Hall sensor unit 71 includes two Hall ICs 75A and 75B axially spaced from each other. A magnetic flux density of at least one of the first magnet member 70A or the second magnet member 70B is detected by at least one of the Hall IC 75A or 75B. A controller 55 switches voltage output of the first and second magnet members 70A and 70B used in determination of operation amount of a brake pedal (stroke amount of an input rod 30). This enlarges a detectable stroke range and improves detection accuracy.

The Hall ICs 75A and 75B used for detection of the magnetic flux density of at least one of the first magnet member 70A or second magnet member 70B, are normally located in the inside of a threaded shaft 40 so as to be magnetically shielded at any time by the threaded shaft 40 formed of a magnetic body, regardless of an axial position of the threaded shaft 40 which is axially displaced by rotation of a nut member 39.

FIG. 5 shows an initial position of a non-braking state in which the input rod 30 and the threaded shaft 40 of the ball screw mechanism 38 are located at most retreated positions. In this state, the controller 55 determines the operation amount of the brake pedal (stroke amount of the input rod 30) by using the magnetic flux density of the first magnet member 70A or the second magnet member 70B, which is detected only by one of the Hall ICs, namely, the Hall IC 75A located close to the first and second magnet members 70A and 70B. At this time, the Hall IC 75A is disposed within a range of a region S in the inside of the threaded shaft 40 and magnetically shielded by the threaded shaft 40. The controller 55 does not use the other Hall IC, namely, the Hall IC 75B located away from the first and second magnet members 70A and 701, for the detection of the magnetic flux density of the first magnet member 70A or the second magnet member 70B. The Hall IC 75B is disposed outside the threaded shaft 40, that is, outside the range of the region S, and therefore is not magnetically shielded by the threaded shaft 40. In other words, according to the present embodiment, the Hall IC 75A is disposed so that an end portion 40B of the threaded shaft 40 (linear-motion member), which is located on a master cylinder 4 side, is positioned on the master cylinder 4 side when the brake pedal 6 is not in operation. In contrast, the Hall IC 75B is disposed so that the master cylinder 4-side end portion 40B of the threaded shaft 40 (linear-motion member) is positioned on the brake pedal 6 side when the brake pedal 6 is not in operation.

Figure 6:
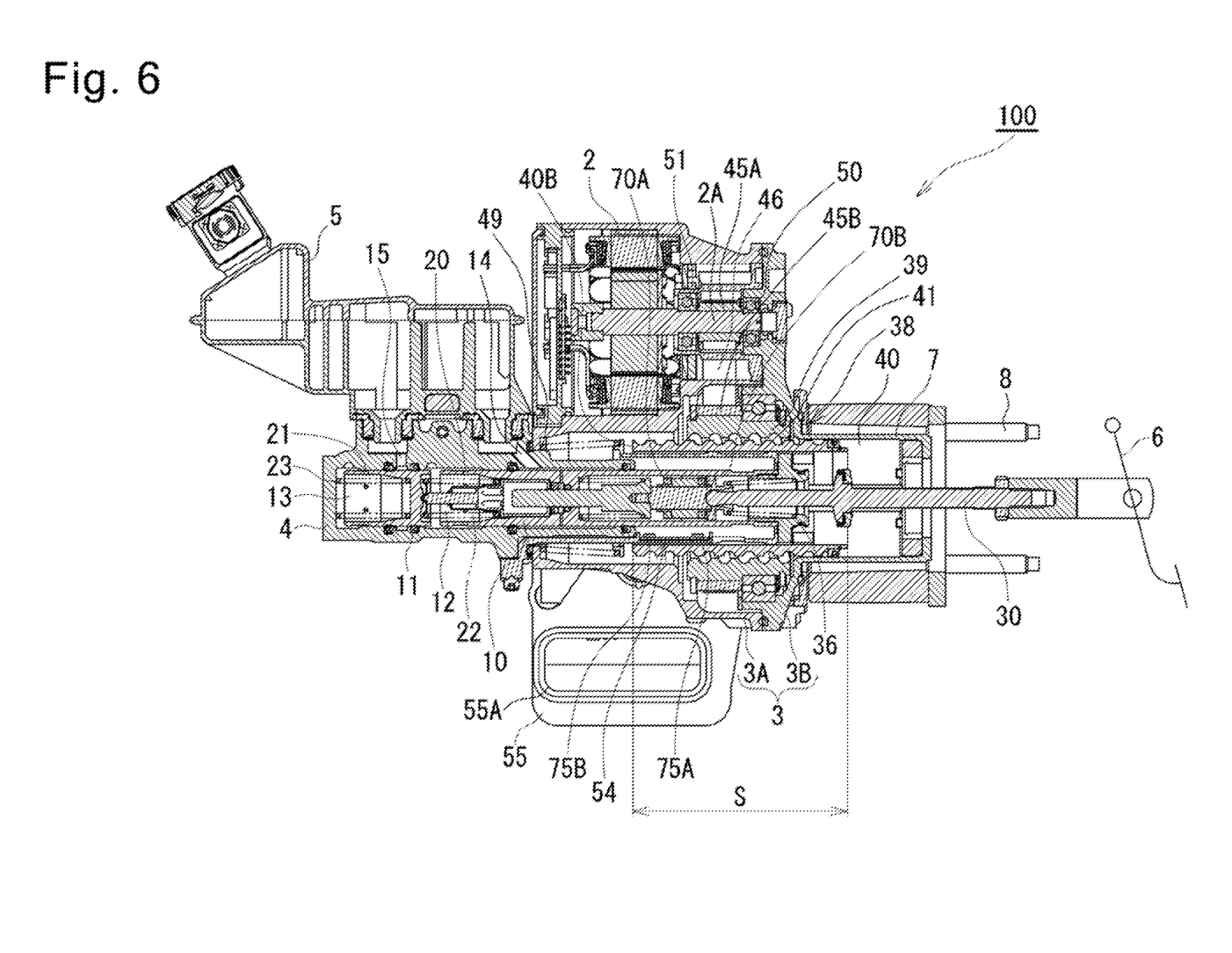
FIG. 6 is a longitudinal sectional view showing an operation state in which a sensor output of a Hall sensor unit is switched in the electric booster shown in FIG. 5.

FIG. 6 shows a state in which the threaded shaft 40 follows a forward movement of the input rod 30 and moves forward. In this state, the first and second magnet members 70A and 70B approach the Hall IC 751 located on the front side. The controller 55 uses the magnetic flux density of the first magnet member 70A or the second magnet member 70B, which is detected by the Hall IC 75B, to determine the operation amount of the brake pedal (stroke amount of the input rod 30). At this time, the fall IC 75B is disposed within the range of the region S in the inside of the threaded shaft 40, and therefore is magnetically shielded by the threaded shaft 40.

As described above, the Hall IC 75A or 75B which is used by the controller 55 to determine the operation amount of the brake pedal (stroke amount of the input rod 30) is normally disposed within the range of the region S in the inside of the threaded shaft 40 and magnetically shielded by the threaded shaft 40 formed of the magnetic body. This makes it possible to reduce an effect of magnetism from outside which is generated by an electric motor 2 or the like and improve detection accuracy of the operation amount of the brake pedal (stroke amount of the input rod 30). Furthermore, since it is not necessary to place both the Hall ICs 75A and 75B in the inside of the threaded shaft 40 at any time, the threaded shaft 40 may have small length, which offers an excellent space efficiency.

Although the Hall IC 75B is not disposed so that the master cylinder 4-side end portion 40B of the threaded shaft 40 (linear-motion member) is positioned on the master cylinder 4 side when the brake pedal 6 is not in operation, the Hall IC 75B may be disposed so that the end portion 40B is positioned on the master cylinder 4 side.

Conceivable electric boosters based on the above-described embodiments are, for example, the ones of the following aspects.

In a first aspect of the electric booster, an electric booster includes an electric motor; an assist mechanism configured to be driven by the electric motor to thrust a piston of a master cylinder, a housing which houses the assist mechanism; an input member connected to a brake pedal and extending in the housing; and a stroke detection device for detecting a stroke of the input member in relation to the housing. The electric booster controls operation of the electric motor by using a control device on the basis of the stroke of the input rod. The stroke detection device includes a magnet member mounted on the input member, and a magnetic flux density detection device mounted on the housing and configured to detect a magnetic flux density generated in the magnet member. The assist mechanism has a linear-motion member formed of a cylindrical magnetic body which thrusts the piston. The magnetic flux density detection device is configured to be positioned inside the linear-motion member at least when the detection of the magnetic flux density of the magnet member by the magnetic flux density detection device is performed.

In a second aspect according to the first aspect, the stroke detection device includes the magnetic flux density detection device including a plurality of magnetic flux density detection devices. Each of the magnetic flux density detection devices is configured to be positioned inside the linear-motion member at least when the detection of the magnetic flux density of the magnet member is performed.

In a third aspect according to either one of the first and second aspects, the magnet member is configured to be positioned inside the linear-motion member when the magnetic flux density detection device detects the magnetic flux density.

In a fourth aspect according to any one of the first to third aspects, an end of the linear-motion member, which is located on the master cylinder side, is positioned closer to the master cylinder than the magnetic flux density detection device while the brake pedal is not in operation.

In a fifth aspect according to any one of the first to fourth aspects, the end of the linear-motion member, which is located on the master cylinder side, is positioned closer to the master cylinder than the magnet member when the brake pedal is not in operation.

Only a few embodiments of the invention have been explained above. One skilled in the art should easily understand that the exemplary embodiments may be modified or improved in various ways without materially departing from the novel teachings and advantages of the invention. Accordingly, all such modifications and improvement are intended to be included within the technical scope of the invention. The embodiments may be combined in any ways.

Although the embodiments of the invention have been discussed on the basis of a few examples, the intention of the embodiments of the invention is not to limit the invention, but to facilitate understanding of the invention. Needless to say, the invention may be modified and improved without deviating from its gist, and its equivalents are included in the invention. The constituent elements mentioned in the claims and description may be combined in any ways or omitted as long as the above-mentioned problem can be at least partially solved or as long as the advantageous effects can be at least partially provided.

The present application claims priority to Japanese Patent Application No. 2015-110856 filed on May 29, 2015. The entire disclosure of Japanese Patent Application No. 2015-110856 filed on May 29, 2015, including the description, claims, drawings and abstract, is incorporated herein by reference in its entirety.

The entire disclosure of Japanese Unexamined Patent Application Publication (Kokai) No. 2015-21745 (Patent Literature 1), including the description, claims, drawings and abstract, is incorporated herein by reference in its entirety.

REFERENCE SIGNS LIST 1 electric booster
2 electric motor
3 housing
4 master cylinder
6 brake pedal
29 input plunger (input member)
40 threaded shaft (linear-motion member)
54 stroke detection device
55 controller (control device)
70A first magnet member (magnet member)
70B second magnet member (magnet member)
75 Hall IC (magnetic flux density detection device)

The invention claimed is:

1. An electric booster comprising:
an electric motor;
an assist mechanism configured to be driven by the electric motor to thrust a piston of a master cylinder;
a housing which houses the assist mechanism;
an input member connected to a brake pedal and extending in the housing;
a stroke detection device configured to detect a stroke amount of the input member in relation to the housing; and
a control device configured to control operation of the electric motor on the basis of the stroke amount of the input member, which is detected by the stroke detection device,
wherein the stroke detection device includes a magnet member mounted on the input member, and a magnetic flux density detection device mounted on the housing and configured to detect a magnetic flux density generated in the magnet member;
wherein the assist mechanism includes a linear-motion member formed of a cylindrical magnetic body which thrusts the piston; and
wherein the magnetic flux density detection device is configured to be positioned inside the linear-motion member at least when the detection of the magnetic flux density of the magnet member by the magnetic flux density detection device is performed.

2. The electric booster of claim 1, wherein the stroke detection device includes the magnetic flux density detection device comprising a plurality of magnetic flux density detection devices, and each of the magnetic flux density detection devices is configured to be positioned inside the linear-motion member at least when the detection of the magnetic flux density of the magnet member is performed.

3. The electric booster of claim 1, wherein the magnetic member is configured to be positioned inside the linear-motion member when the magnetic flux density detection device detects the magnetic flux density.

4. The electric booster of claim 1, wherein an end of the linear-motion member, which is located on the master cylinder side, is positioned closer to the master cylinder than the magnetic flux density detection device while the brake pedal is not in operation.

5. The electric booster of claim 1, wherein the end of the linear-motion member, which is located on the master cylinder side, is positioned closer to the master cylinder than the magnet member when the brake pedal is not in operation.

6. The electric booster of claim 2, wherein the magnetic member is configured to be positioned inside the linear-motion member when the magnetic flux density detection device detects the magnetic flux density.

7. The electric booster of claim 6, wherein an end of the linear-motion member, which is located on the master cylinder side, is positioned closer to the master cylinder than the magnetic flux density detection device while the brake pedal is not in operation.

8. The electric booster of claim 7, wherein the end of the linear-motion member, which is located on the master cylinder side, is positioned closer to the master cylinder than the magnet member when the brake pedal is not in operation.

9. The electric booster of claim 2, wherein an end of the linear-motion member, which is located on the master cylinder side, is positioned closer to the master cylinder than the magnetic flux density detection device while the brake pedal is not in operation.

10. The electric booster of claim 9, wherein the end of the linear-motion member, which is located on the master cylinder side, is positioned closer to the master cylinder than the magnet member when the brake pedal is not in operation.

11. The electric booster of claim 2, wherein the end of the linear-motion member, which is located on the master cylinder side, is positioned closer to the master cylinder than the magnet member when the brake pedal is not in operation.

12. The electric booster of claim 3, wherein an end of the linear-motion member, which is located on the master cylinder side, is positioned closer to the master cylinder than the magnetic flux density detection device while the brake pedal is not in operation.

13. The electric booster of claim 12, wherein the end of the linear-motion member, which is located on the master cylinder side, is positioned closer to the master cylinder than the magnet member when the brake pedal is not in operation.

14. The electric booster of claim 3, wherein the end of the linear-motion member, which is located on the master cylinder side, is positioned closer to the master cylinder than the magnet member when the brake pedal is not in operation.

15. The electric booster of claim 4, wherein the end of the linear-motion member, which is located on the master cylinder side, is positioned closer to the master cylinder than the magnet member when the brake pedal is not in operation.

* * * * *